United States Patent
Furuichi et al.

(10) Patent No.: US 9,668,341 B2
(45) Date of Patent: May 30, 2017

(54) WIRING SUBSTRATE AND METHOD OF MAKING WIRING SUBSTRATE

(71) Applicant: SHINKO ELECTRIC INDUSTRIES CO., LTD., Nagano (JP)

(72) Inventors: Jun Furuichi, Nagano (JP); Noriyoshi Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/158,777

(22) Filed: May 19, 2016

(65) Prior Publication Data

US 2016/0353569 A1    Dec. 1, 2016

(30) Foreign Application Priority Data

May 28, 2015   (JP) ................................. 2015-108812

(51) Int. Cl.
*H05K 1/02* (2006.01)
*H05K 3/46* (2006.01)
*H05K 1/11* (2006.01)

(52) U.S. Cl.
CPC .......... *H05K 1/0298* (2013.01); *H05K 1/115* (2013.01); *H05K 3/4623* (2013.01); *H05K 2201/0183* (2013.01)

(58) Field of Classification Search
CPC ...... H05K 1/0298; H05K 1/115; H05K 1/116; H05K 3/4623; H05K 3/429; H05K 3/4038
See application file for complete search history.

(56) References Cited

U.S. PATENT DOCUMENTS

| 9,000,302 B2 | 4/2015 | Shimizu et al. | |
| 2012/0073870 A1* | 3/2012 | Jeon | H01L 21/486 174/262 |
| 2016/0212852 A1* | 7/2016 | Hu | H05K 1/181 |

FOREIGN PATENT DOCUMENTS

JP   2014-225632   12/2014

* cited by examiner

*Primary Examiner* — Hoa C Nguyen
*Assistant Examiner* — Amol Patel
(74) *Attorney, Agent, or Firm* — IPUSA, PLLC

(57) ABSTRACT

A wiring substrate includes a core layer having a penetrating hole, a first insulating layer disposed on a first surface of the core layer and having a first opening at a position of the penetrating hole, the first insulating layer containing no filler, a penetrating electrode disposed in the penetrating hole and in the first opening, and a first wiring layer laminated both on the first insulating layer at a first surface thereof facing away from the core layer and on an end face of the penetrating electrode, wherein the first surface of the first insulating layer and the end face of the penetrating electrode are planarized.

5 Claims, 9 Drawing Sheets

WIRING SUBSTRATE AND METHOD OF MAKING WIRING SUBSTRATE

CROSS-REFERENCE TO RELATED APPLICATIONS

The present application is based upon and claims the benefit of priority from the prior Japanese Patent Application No. 2015-108812 filed on May 28, 2015, with the Japanese Patent Office, the entire contents of which are incorporated herein by reference.

FIELD

The disclosures herein relate to a wiring substrate and a method of making a wiring substrate.

BACKGROUND

A certain type of wiring substrate known in the art includes a core layer, a first insulating layer formed at one surface of the core layer, a second insulating layer laminated on the first insulating layer, a third insulating layer formed at the other surface of the core layer, and a solder resist layer laminated on the third insulating layer. Each of the first insulating layer and the second insulating layer includes a plurality of insulating films. The first insulating layer further includes a first wiring layer formed therein. The surface of the first wiring layer on which the second insulating layer is laminated has a second wiring layer formed thereon. The first insulating layer and the third insulating layer are made of thermosetting resin. The second insulating layer and the solder resist layer are made of photosensitive resin. The first insulating layer has a first via interconnection embedded therein, and the second insulating layer has a second via interconnection embedded therein. One end face of the first via interconnection embedded in the first insulating layer is exposed at the uppermost layer of the first insulating layer on which the second insulating layer is laminated. This end face is directly bonded with the second wiring layer. The surface of the first insulating layer on which the second insulating layer is laminated is a polished surface. The second wiring layer has a higher wiring density than the first wiring layer (see Patent Document 1, for example).

The wiring substrate disclosed in Patent Document 1 has the second wiring layer formed on the first insulating layer that includes the first wiring layer and the first via interconnection embedded therein.

This arrangement makes it difficult to reduce the thickness of the wiring substrate disclosed in Patent Document 1.
[Patent Document 1] Japanese Laid-open Patent Publication No. 2014225632

SUMMARY

According to an aspect of the embodiment, a wiring substrate includes a core layer having a penetrating hole, a first insulating layer disposed on a first surface of the core layer and having a first opening at a position of the penetrating hole, the first insulating layer containing no filler, a penetrating electrode disposed in the penetrating hole and in the first opening, and a first wiring layer laminated both on the first insulating layer at a first surface thereof facing away from the core layer and on an end face of the penetrating electrode, wherein the first surface of the first insulating layer and the end face of the penetrating electrode are planarized.

According to an aspect of the embodiment, a method of making a wiring substrate includes forming a first insulating layer containing no filler on a first surface of a core layer, forming a penetrating hole penetrating the core layer and the first insulating layer in a thickness direction thereof, forming a penetrating electrode in the penetrating hole, forming a first plating layer on the first insulating layer at a first surface thereof facing away from the core layer, performing polishing to remove the first plating layer and further to planarize the first surface of the first insulating layer and an end face of the penetrating electrode, and forming a first wiring layer on the first surface of the first insulating layer and the end face of the penetrating electrode.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, a description will be given of embodiments of a wiring substrate and a method of making a wiring substrate.

Figure 1:
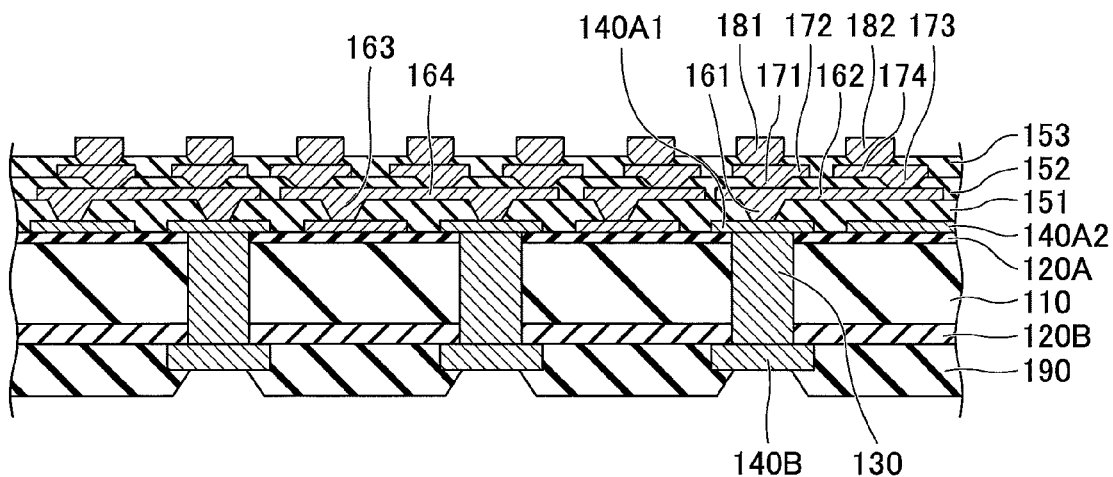
FIG. 1 is a cross-sectional view of a wiring substrate according to an embodiment.

FIG. 1 is a cross-sectional view of a wiring substrate 100 according to an embodiment.

The wiring substrate 100 includes a core substrate 110, insulating layers 120A and 120B, a penetrating electrode 130, wiring layers 140A1, 140A2, and 140B, insulating layers 151, 152, and 153, vias 161 and 163, a wiring layer 162 and 164, vias 171 and 173, a wiring layer 172 and 174, a wiring layer 181 and 182, and a solder resist layer 190.

FIG. 1 illustrates the structure in which the insulating layer 120A, the wiring layer 140A1 and 140A2, the insulating layers 151, 152, and 153, the vias 161 and 163, the wiring layer 162 and 164, the vias 171 and 173, the wiring layer 172 and 174, and the wiring layer 181 and 182 are formed on the upper side of the core substrate 110. Further, the structure also has the insulating layer 120B, the wiring layer 140B, and the solder resist layer 190 formed on the lower side of the core substrate 110. It may be noted that reference to the upper and lower positions is made only for the sake of explanation, and that the wiring substrate 100 may be used upside-down or at any placement angle.

Although a surface illustrated as facing upwards in the drawings will be referred to as an upper surface and a surface illustrated as facing downwards will be referred to as a lower surface in the following descriptions, the phrases "upper surface" and "lower surface" are only the names used for explanation purposes, and are not intended to be permanently placed in such positions to face upwards and downwards, respectively. In the case of the wiring substrate 100 illustrated in FIG. 1 being flipped upside-down, the upper surface and the lower surface will be changed into a lower surface and an upper surface, respectively.

In the following, the thickness of a given element refers to the thickness of the corresponding layer, and refers to the length thereof in the vertical direction in the drawings.

In one example of the wiring substrate 100 illustrated in FIG. 1, the upper surface side is where an IC (integrated circuit) chip is mounted, and the lower surface side is where a BGA (ball grid array) is mounted.

The core substrate 110 may include the insulating layers 120A and 120B disposed on the opposite surfaces of a base material obtained by impregnating glass cloth with epoxy resin. The core substrate 110 has the penetrating electrode 130 formed therethrough. The thickness of the core substrate 110 may be 0.2 mm, for example.

The insulating layers 120A and 120B are primer layers containing resin only without fillers, and are attached to the opposite surfaces of the core substrate 110. The thicknesses of the insulating layers 120A and 120B may be 3 micrometers, for example. The insulating layers 120A and 120E are an example of the first insulating layer and the second insulating layer, respectively.

The insulating layers 120A and 120B may be made of a resin composition for a primer layer. The resin composition may include multifunctional epoxy resin, an epoxy resin curing agent, and phenolic hydroxyl group-containing polybutadiene-modified polyamide resin, for example. The insulating layers 120A and 120B are primers for a plating process. The phenolic hydroxyl group-containing polybutadiene-modified polyamide resin has a structural unit represented by the following chemical formulas (i), (ii), and (iii).

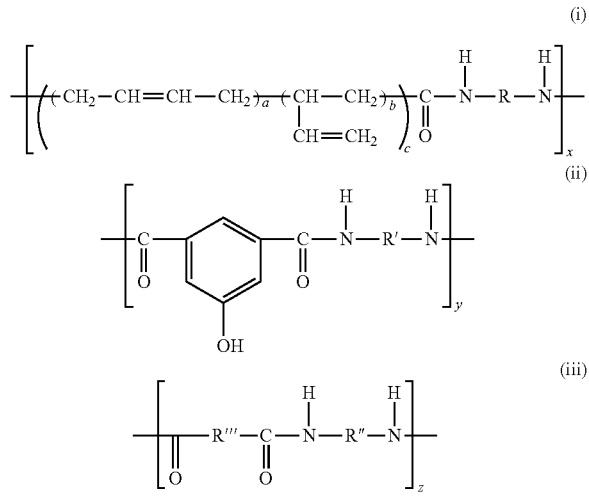

The insulating layer 120A has the upper surface thereof that is planarized by a polishing process. The upper surface of the insulating layer 120A is planarized because the wiring layer 140A1 and 140A2 having minute patterns is formed directly on the upper surface of the insulating layer 120A. The term "planarized surface" means the surface having sufficient flatness for the purpose of forming the wiring layer 140A1 and 140A2 having minute patterns. The term "minute pattern" means the wiring layer pattern having a line width of 5 or less micrometers such as the wiring layer 140A1 and 140A2, for example.

The surface flatness of the core substrate 110 is low because of the use of a glass-cloth base material. Conventionally, a wiring layer having minute patterns is formed on a core substrate by securing surface flatness through the formation of an insulating layer having sufficient thickness. Further, a via is formed through the insulating layer in order to establish electrical coupling between the wiring layer having minute patterns formed on the flat surface and a penetrating electrode disposed in the core substrate. The insulating layer generally includes a filler such as silica ($SiO_2$) from the viewpoint of providing sufficient stiffness.

The use of such a configuration makes it difficult to reduce the thickness of a conventional wiring substrate. Namely, the insulating layer on the upper surface of the core substrate needs to have sufficient thickness.

On the other hand, the insulating layer 120A is a resin layer including no fillers, and has a planarized upper surface that allows the wiring layer 140A1 and 140A2 having minute patterns to be formed thereon. This arrangement enables the thinning of the wiring substrate 100 of the embodiment.

It may be noted that the insulating layer 1206 is not planarized. The insulating layer 120B may include a filler.

The penetrating electrode 130 is a through-hole that is formed at a hole penetrating the core substrate 110 in the thickness direction thereof. The penetrating electrode 130 may be made by utilizing a plating process to produce a copper lining on the inner wall of the penetrating hole formed through the core substrate 110, or to fill the penetrating hole with copper plating. The upper and lower ends of the penetrating electrode 130 are connected to the wiring layer 140A1 and the wiring layer 140B, respectively.

The wiring layer 140A1 and 140A2 is disposed on the upper surface of the insulating layer 120A. The wiring layer 140A1 and 140A2, which is a first fine layer (i.e., FL1), is thinner than the wiring layer 140B and produced by microfabrication. In the cross-section illustrated in FIG. 1, the wiring layer pattern 140A1 is connected to the penetrating electrode 130, and the wiring layer pattern 140A2 is not connected to the penetrating electrode 130. The wiring layer 140A1 and 140A2 is an example of the first wiring layer.

The wiring layer 140A1 and 140A2 include wires having predetermined patterns in a plan view. The wiring layer 140A1 and 140A2 is formed by a plating process, for example, on the upper surface of the insulating layer 120A.

The wiring layer 1402 is disposed on the lower surface of the insulating layer 120B. The wiring layer 140B is made by a plating process similarly to the wiring layer 140A1 and 140A2, but is thicker than the wiring layer 140A1 and 140A2. Unlike the wiring layer 140A1 and 140A2, the wiring layer 140B is not made into minute patterns.

The portion of the wiring layer 140B exposed from the solder resist layer 190 serves as a pad that is to be connected to a BGA or the like. The wiring layer 140B is used as a power supply layer, a ground layer, or a signal layer, for example. The wiring layer 140B is an example of the second wiring layer.

The insulating layers 151, 152, and 153 are disposed on the upper surface side of the insulating layer 120A for the purpose of providing inter-layer insulation for the wiring layer 140A1 and 140A2, the vias 161 and 163, the wiring layer 162 and 164, the vias 171 and 173, the wiring layer 172 and 174, and the wiring layer 181 and 182.

The insulating layers 151, 152, and 153, which are film-shaped layers made of epoxy resin or polyimide resin, are an example of insulating layers of a build-up substrate. The total combined thickness of the insulating layers 151, 152, and 153 may range approximately from 20 micrometers to 30 micrometers, for example.

The vias 161 and 163 have the lower ends thereof connected to the wiring layer patterns 140A1 and 140A2, respectively, and have the upper ends thereof connected to the wiring layer patterns 162 and 164, respectively. The vias 161 and 163 are formed in the insulating layer 151.

The wiring layer patterns 162 and 164 are connected to the upper ends of the vias 161 and 163, respectively. The wiring layer patterns 162 and 164 are formed in the insulating layer 152. The wiring layer 162 and 164 is a second fine layer (i.e., FL2).

The vias 171 and 173 have the lower ends thereof connected to the wiring layer 162, and have the upper ends thereof connected to the wiring layer patterns 172 and 174, respectively. The vias 171 and 173 are formed in the insulating layer 152.

The wiring layer patterns 172 and 174 are connected to the upper ends of the vias 171 and 173, respectively. The wiring layer patterns 172 and 174 are formed in the insulating layer 153.

The wiring layer patterns 181 and 182 are connected to the upper surfaces of the wiring layer patterns 172 and 174, respectively. The wiring layer 181 and 182 together with the wiring layer 172 and 174 constitute a third fine layer (i.e., FL3).

The wiring layer patterns 181 and 182 have the lower ends thereof embedded in the insulating layer 153, and have the upper ends thereof exposed from the insulating layer 153. The wiring layer patterns 181 and 182 may be used as pads for mounting an IC chip or the like.

The thickness of the wiring layer 140A1 and 140A2 serving as the FL1 layer is 2 micrometers, and the thickness of the wiring layer 162 and 164 serving as the FL2 layer is 2 micrometers, for example. The total combined thickness of the wiring layer 172 and 174 and the wiring layer 181 and 182 together serving as the FL3 layer is 10 micrometers, for example.

The solder resist layer 190 is formed to cover the lower surface of the insulating layer 120B, the lateral faces of the wiring layer 140B, and the edges (i.e., perimeter) of the lower surface of the wiring layer 140B. The solder resist layer 190 may be made by use of photosensitive insulating resin containing phenolic resin, polyimide resin, or like as a main component, for example. The solder resist layer 190 may contain a filler such as silica ($SiO_2$).

The thickness of the solder resist layer 190 is substantially the same as the total combined thickness of the insulating layers 151, 152, and 153. The insulating layers 151, 152, and 153 may be made by use of photosensitive insulating resin containing phenolic resin, polyimide resin, or like as a main component, for example.

In the following, the method of making the wiring substrate 100 will be described by referring to FIGS. 2A-2D through FIGS. 8A and 8B.

FIGS. 2A-2D through FIGS. 8A and 8B are drawings illustrating the processes for making the wiring substrate 100.

Figure 2A:
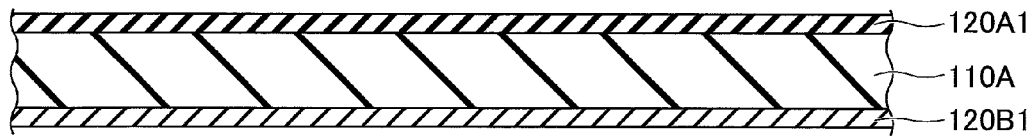
FIGS. 2A through 2D are drawings illustrating the processes for making the wiring substrate.

As illustrated in FIG. 2A, insulating layers 120A1 and 120B1 are attached to the opposite surfaces of a core substrate 110A to produce an illustrated structure. The core substrate 110A will be made into the core substrate 110 by forming penetrating holes therethrough. The insulating layer 120A1 will be made into the insulating layer 120A by forming the openings for making the penetrating electrodes 130 and by polishing the upper surface thereof. The insulating layer 120B1 will be made into the insulating layer 120B by forming the openings for making the penetrating electrodes 130.

The insulating layers 120A1 and 120B1 may be made by a hot press process applied to a partially cured organic material as described above on the surfaces of the core substrate 110A.

Figure 2B:
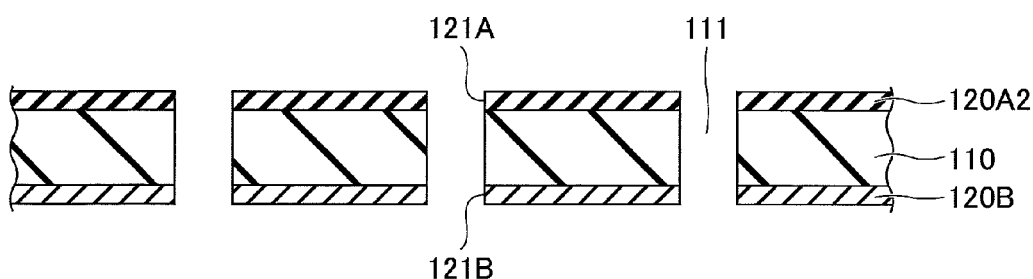

The structure illustrated in FIG. 2A is subjected to drilling, thereby producing the core substrate 110 and insulating layers 120A2 and 120B that have penetrating holes 111 and openings 121A and 121B as illustrated in FIG. 2B. The inner diameters of the penetrating holes 111 and the openings 121A and 121B are equal to the outer diameter of the penetrating electrodes 130 which will be made later. This production process turns the core substrate 110A into the core substrate 110, and turns the insulating layers 120A1 and 120B1 into the insulating layers 120A2 and 120B, respectively. The insulating layer 120A2 will be made into the insulating layer 120A by polishing the upper surface thereof.

The penetrating holes 111 and the openings 121A and 121B may be made by a laser process instead of a drilling process. The penetrating holes 111 may be tapered such that the inner diameters of the openings 121A and 121B are different from each other.

Figure 2C:
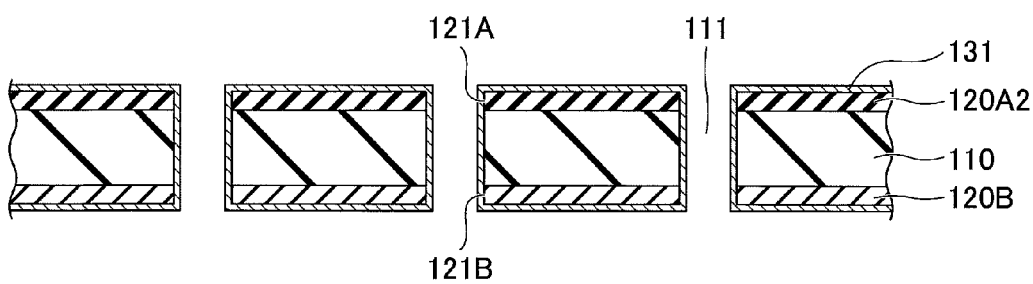

Subsequently, a seed layer 131 is formed as illustrated in FIG. 2C. The seed layer 131 may be made by utilizing an electroless plating process to form a thin copper film.

Figure 2D:
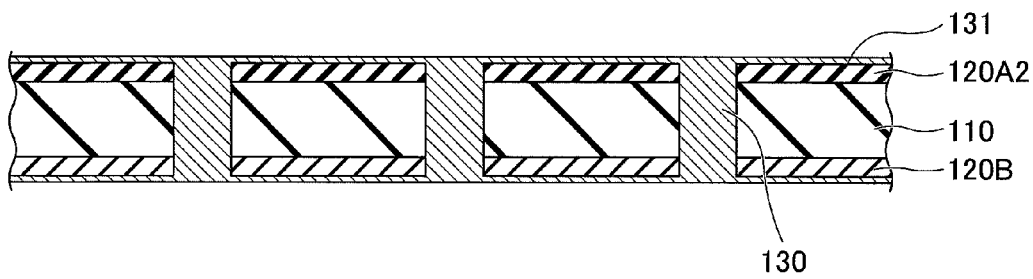

An electroplating process is then performed by feeding electric power to the seed layer 131 to form the penetrating electrodes 130 as illustrated in FIG. 2D. The penetrating electrodes 130 are formed seamlessly with the seed layer 131 on the inner wall of the penetrating holes 111. In this example, the penetrating electrodes 130 are made by copper plating.

Figure 3A:
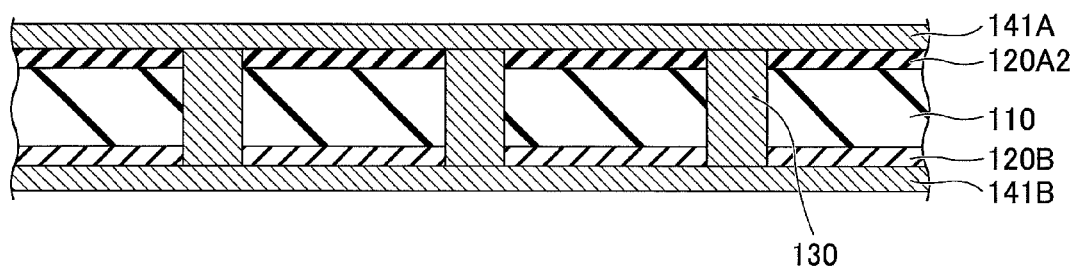
FIGS. 3A through 3C are drawings illustrating the processes for making the wiring substrate.

An electroplating process is thereafter applied to the upper surface and lower surface of the structure illustrated in FIG. 2D, thereby producing plating layers 141A and 141B illustrated in FIG. 3A. The plating layers 141A and 141B are copper plating in this example. The plating layers 141A and 141B are formed seamlessly with the seed layer 131 on the upper surface of the insulating layer 120A2 and on the lower surface of the insulating layer 120B. The thickness of the plating layers 141A and 141B is equal to the thickness of the wiring layer 140B. The production process illustrated in FIG. 2D may be performed concurrently with the production process illustrated in FIG. 3A.

Figure 3B:
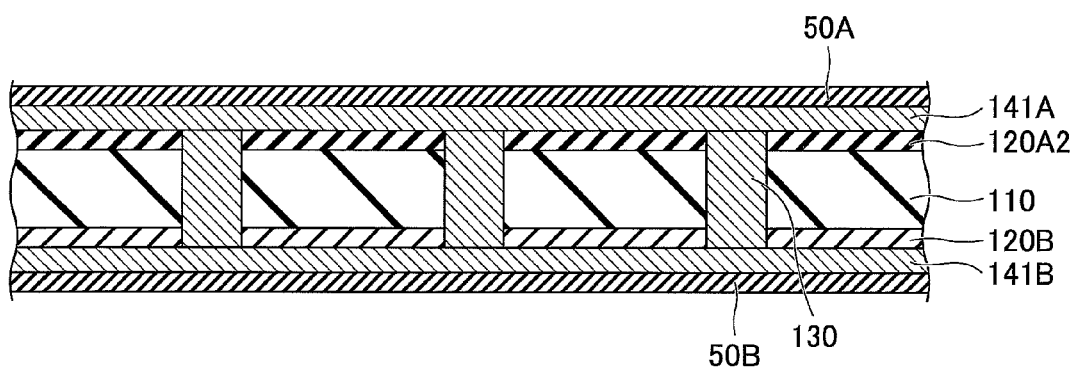

Subsequently, resist layers 50A and 50B are formed on the upper and lower surfaces of the structure illustrated in FIG. 3A, respectively, to produce the structure illustrated in FIG. 3B. The resist layers 50A and 50B are made of photosensitive resin and used for making the FL1 layer.

Figure 3C:
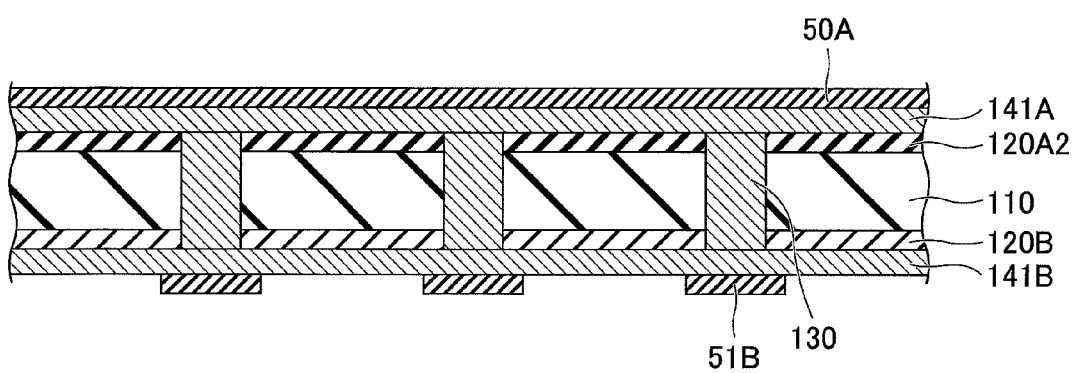

The resist layer 50B is patterned so as to leave portions thereof having the same patterns as the wiring layer 140B that will be produced in the end, thereby producing the structure illustrated in FIG. 3C. Patterning of the resist layer 50B may be performed by photolithography. This production process turns the resist layer 50B of FIG. 3B into a resist layer 51B.

Figure 4A:
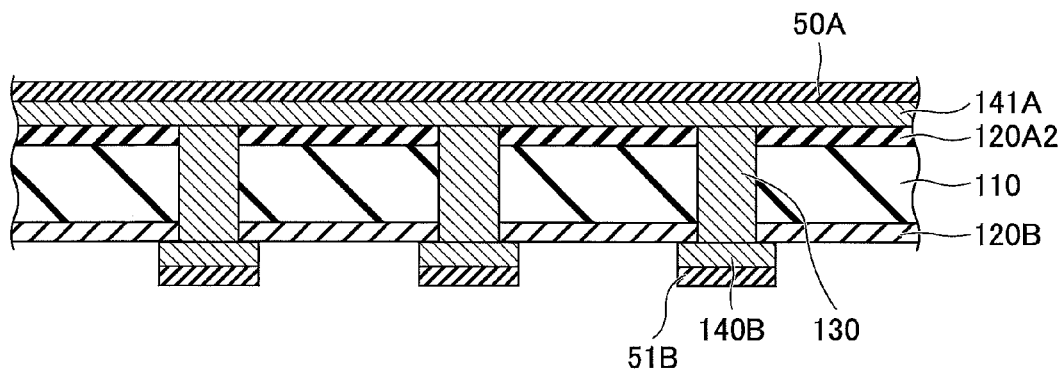
FIGS. 4A through 4C are drawings illustrating the processes for making the wiring substrate.

After this, the resist layer 51B is utilized to etch the plating layer 141B to form the wiring layer 140B as illustrated in FIG. 4A. The etching of the plating layer 141B may be performed by a stripping process that uses a stripping solution.

Figure 4B:
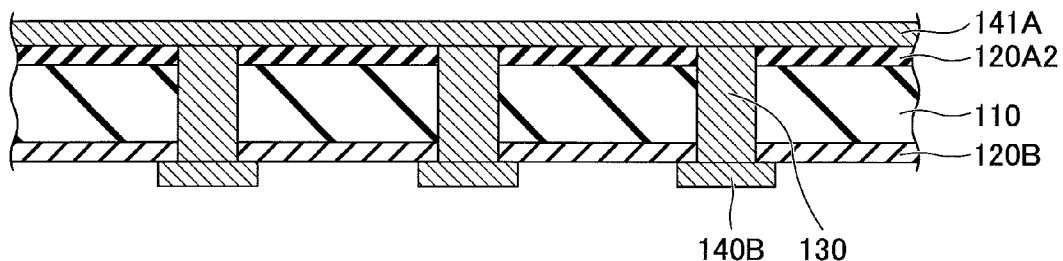

The resist layers 50A and 51B are then removed to produce the structure illustrated in FIG. 4B. Removal of the resist layers 50A and 51B may be performed by a stripping process that uses a stripping solution.

Figure 4C:
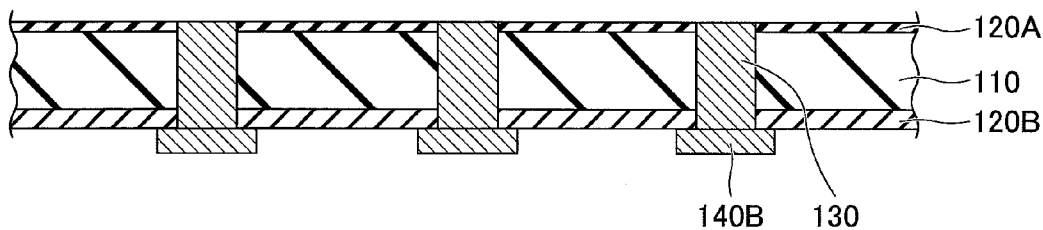

Thereafter, the upper surface of the structure illustrated in FIG. 4B is planarized to remove the plating layer 141A and to polish the upper surface of the insulating layer 120A2 to produce the structure illustrated in FIG. 4C. This production process turns the insulating layer 120A2 into the insulating layer 120A.

Polishing of the plating layer 141A and the insulating layer 120A2 may be performed by CMP (chemical mechanical polishing), for example. In the case of the thickness of the insulating layer 120A2 being 3 micrometers, for example, 1 micrometer, more or less, of the material may be removed from the insulating layer 120A2 by polishing, thereby to produce the insulating layer 120A having a thickness of 2 micrometers. The 2-micrometer thickness allows the insulating layer 120A to absorb the unevenness of the upper surface of the core substrate 110, so that the upper surface of the insulating layer 120A has a sufficient flatness suitable for forming the wiring layer 140A1 and 140A2 having minute structures.

Subsequently, a seed layer 142A is formed on the upper surface of the structure illustrated in FIG. 4C to produce the structure illustrated in FIG. 5A. The seed layer 142A is formed for the purpose of subsequently forming a wiring layer 140A. The seed layer 142A may be a thin copper film formed by an electroless plating process.

Figure 5A:
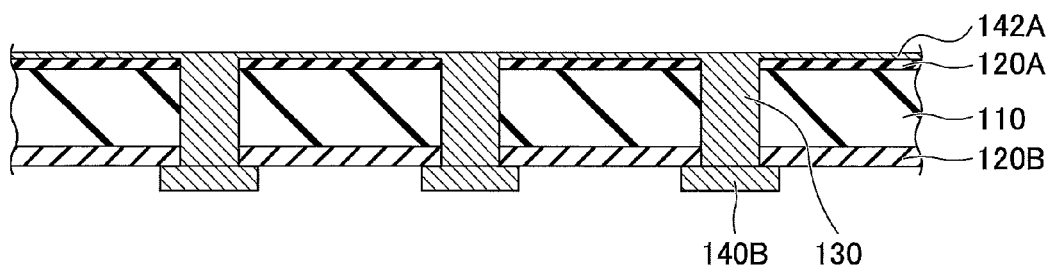
FIGS. 5A through 5C are drawings illustrating the processes for making the wiring substrate.
Figure 5B:
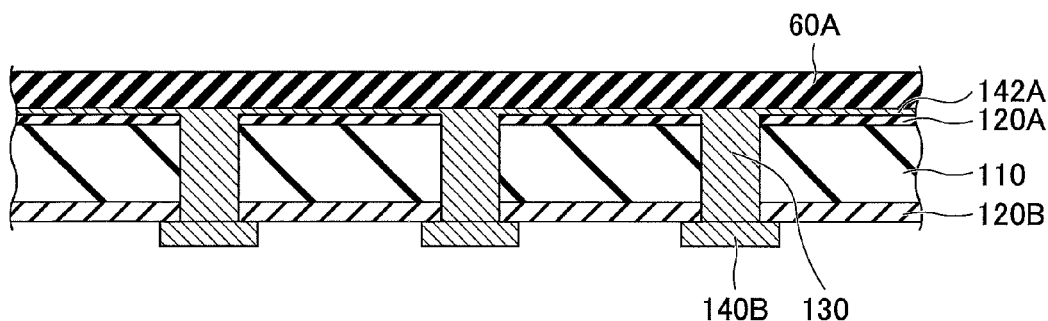

A resist layer 60A is then formed on the upper surface of the seed layer 142A of FIG. 5A as illustrated in FIG. 5B. The resist layer 60A may be formed by applying photosensitive liquid resist through spin coating.

Etching is performed to leave portions of the resist layer 60A of FIG. 5B at the same positions as the boundaries between the wiring layer patterns 140A1 and 140A2 that will be later produced, thereby producing the structure illustrated in FIG. 5C. This etching process turns the resist layer 60A illustrated in FIG. 5B into a resist layer 61A of FIG. 5C.

Removal of the resist layer 60A may be performed by a stripping process that utilizes a stripping solution.

Figure 5C:
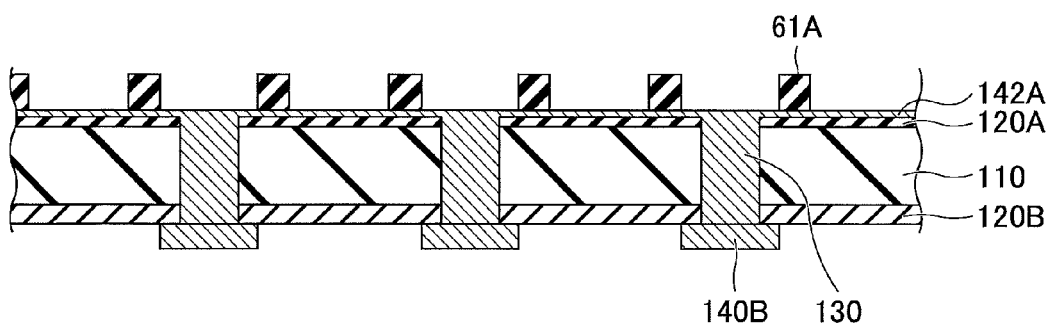
Figure 6A:
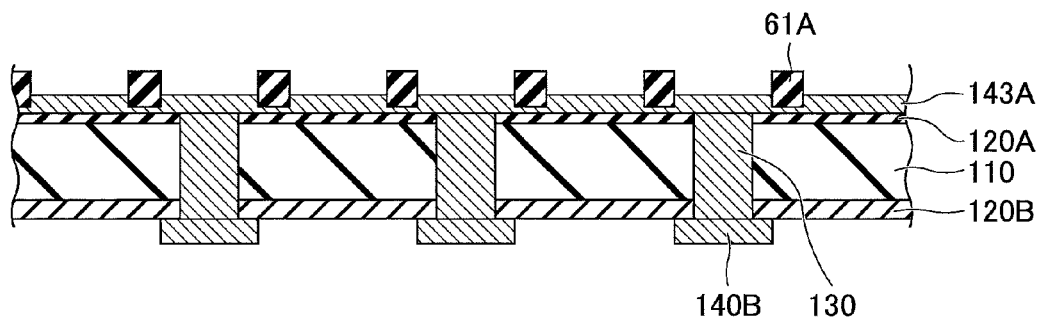
FIGS. 6A through 6C are drawings illustrating the processes for making the wiring substrate.

Thereafter, an electroplating process is performed to form a plating layer on the upper surface of the seed layer 142A illustrated in FIG. 5C, so that a plating layer 143A formed on the upper surface of the insulating layer 120A is obtained as illustrated in FIG. 6A. The plating layer 143A is formed to have a proper thickness such that the height of the step formed by the resist layer 61A and the plating layer 143A is equal to the thickness of the wiring layer 140A1 and 140A2 which will be produced later.

The resist layer 61A illustrated in FIG. 6A is removed to produce the structure as illustrated in FIG. 63. The resist layer 61A may be removed by a stripping process using a stripping solution.

Figure 6B:
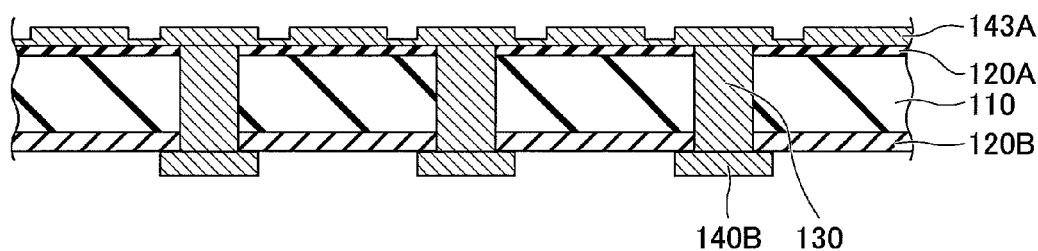
Figure 6C:
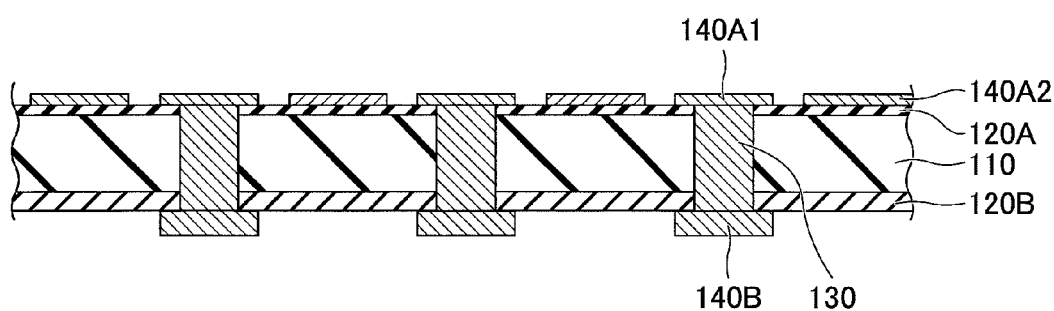

Subsequently, a reverse sputtering process, for example, is performed with respect to the plating layer 143A of FIG. 6B to produce the wiring layer 140A1 and 140A2 as illustrated in FIG. 6C. This reverse sputtering process removes from the plating layer 143A a thickness equal to the thickness of the seed layer 142A (see FIG. 5C).

This arrangement removes, from the plating layer 143A, the seed layer 142A that was situated under the resist layer 61A (see FIG. 6A), so that the remaining portions are turned into the wiring layer 140A1 and 140A2. In place of the reverse sputtering process, a stripping solution may be used to remove the plating layer 143A.

Figure 7A:
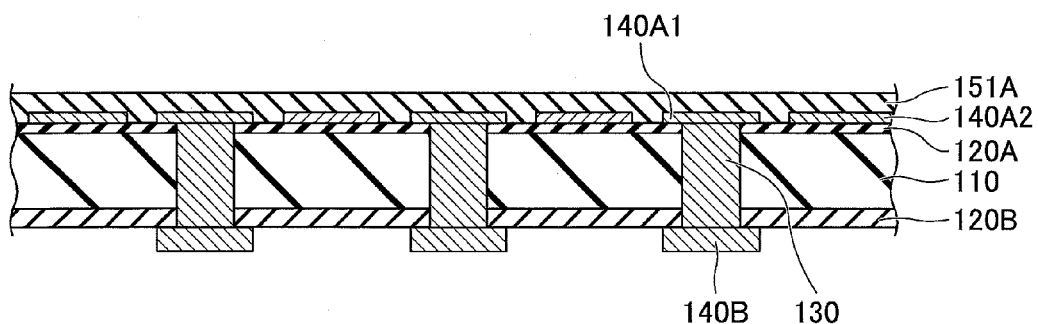
FIGS. 7A through 7C are drawings illustrating the processes for making the wiring substrate.

As illustrated in FIG. 7A, an insulating layer 151A is formed on the upper surface of the structure illustrated in FIG. 6C. The insulating layer 151A will be later made into the insulating layer 151. A vacuum laminator may apply heat and pressure to a resin film to laminate the insulating layer 151A, for example. The resin film may be made of epoxy or polyimide, for example.

Figure 7B:
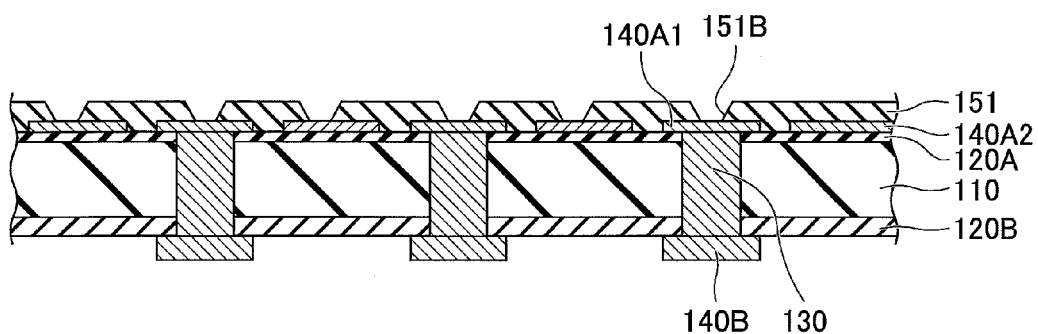

The insulating layer 151A (see FIG. 7A) is processed to form via holes 151B as illustrated in FIG. 7B. The via holes 151B may be formed by a laser process, for example. This production process turns the insulating layer 151A into the insulating layer 151.

Figure 7C:
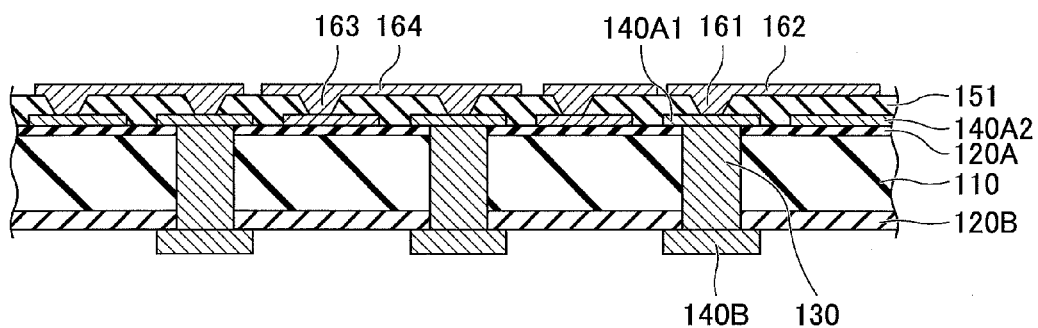

As illustrated in FIG. 7C, the vias 161 and 163 and the wiring layer 162 and 164 are formed on the upper surface of the structure illustrated in FIG. 7B. The vias 161 and 163 and the wiring layer 162 and 164 may be formed by forming an electroless plating layer on the upper surface of the insulating layer 151 and the inner walls of the via holes 151B and then performing an electroplating process.

The insulating layer 152 is then formed on the structure illustrated in FIG. 7C, followed by forming the vias 171 and 173 and the wiring layer 172 and 174. Further, the insulating layer 153 is formed, followed by forming the wiring layer 181 and 182, thereby producing the structure illustrated in FIG. 8A.

As in the case of forming the insulating layer 151, a vacuum laminator may apply heat and pressure to a resin film to laminate the insulating layer 152.

Similarly to the process of forming the vias 161 and 163 and the wiring layer 162 and 164 on the insulating layer 151, the vias 171 and 173 and the wiring layer 172 and 174 are formed by an electroless plating and a subsequent electroplating process.

As in the case of forming the insulating layers 151 and 152, a vacuum laminator may apply heat and pressure to a resin film to laminate the insulating layer 153.

Figure 8A:
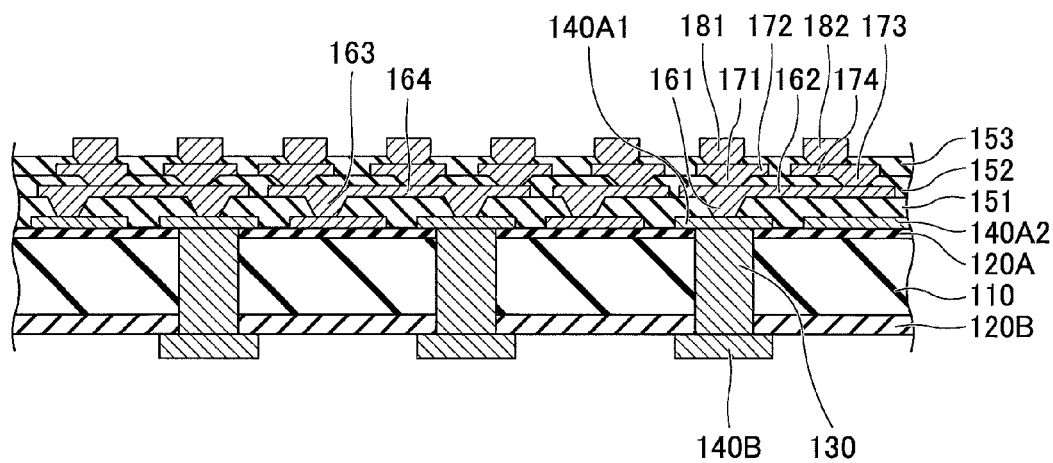
FIGS. 8A and 8B are drawings illustrating the processes for making the wiring substrate.
Figure 8B:
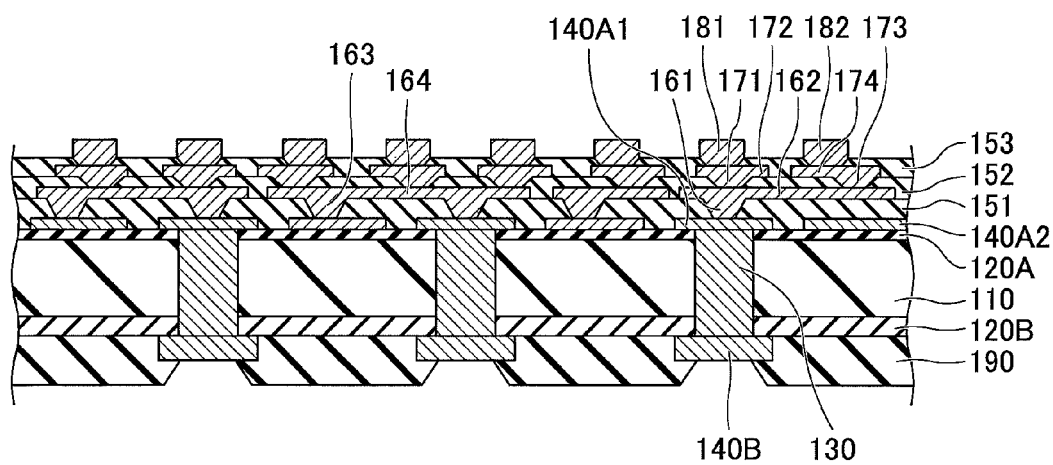

At the end, the solder resist layer 190 is formed on the lower surface of the structure illustrated in FIG. 8A. A vacuum laminator may apply heat and pressure to a resin film to laminate the solder resist layer 190. The resin film may be made of epoxy or polyimide, for example.

With the processes described above, the wiring substrate 100 is obtained.

The wiring substrate 100 of the embodiment has the insulating layer 120A with a planarized surface formed on the upper surface of the core substrate 110, and has the wiring layer 140A1 and 140A2 having minute patterns formed on the insulating layer 120R. Further, the insulating layers 151, 152, and 153, the vias 161 and 163, the wiring layer 162 and 164, the vias 171 and 173, the wiring layer 172 and 174, and the wiring layer 1B1 and 182 are formed. The wiring layer 162 and 164 and the wiring layer 172 and 174 have microminiaturized lines similarly to the wiring layer 140A1 and 140A2.

The above-noted arrangement enables the thinning of the structure mounted on the upper side of the core substrate 110, thereby providing the wiring substrate 100 with a reduced thickness.

An interposer made by use of a silicon substrate is easily made into a thin structure by utilizing the semiconductor manufacturing technology. However, the use of organic substrate materials such as those of the core substrate 110 and the insulating layers 151, 152, and 153 presents difficulties in thinning the structure.

In the present embodiment, the insulating layer 120A that has a planarized surface made by a polishing process is directly disposed on the core substrate 110, and has the following elements formed thereon: the wiring layer 140A1 and 140A2, the insulating layers 151, 152, and 153, the vias 161 and 163, the wiring layer 162 and 164, the vias 171 and 173, the wiring layer 172 and 174, and the wiring layer 181 and 182.

This arrangement enables the provision of the wiring substrate 100 that uses organic substrate materials yet has a reduced thickness. Because of the use of organic substrate materials, the wiring substrate 100 can be produced at considerably lower cost than an interposer made by use of a silicon substrate or the like.

In the case of mounting a semiconductor element such as an IC chip, it is a known fact that the semiconductor element is easily mounted on the wiring substrate 100 that is bulging downwards at the center in a cross-sectional view when the wiring substrate 100 with the element mounting surface thereof facing upwards is viewed from a lateral direction.

The wiring substrate 100 of the embodiment has the lower-side insulating layers (i.e., the insulating layer 120B and the solder resist layer 190) thicker than the upper-side insulating layers (i.e., the insulating layer 120A and the insulating layers 151, 152, and 153). In the case of these upper-side and lower-side insulating layers being made of resin containing no fillers, therefore, the thermal expansion coefficient of the lower-side insulating layers can be made greater.

The provision of the lower-side insulating layers having greater thermal expansion coefficients causes the wiring substrate 100 with the element mounting surface thereof facing upwards to bulge downwardly at the center thereof as viewed in a cross-sectional view, thereby serving to improve efficiency in the mounting of a semiconductor element.

The descriptions provided heretofore have been directed to a case in which the penetrating electrodes 130 and the wiring layer 140B are produced in respective distinct processes. Alternatively, the penetrating electrodes 130 and the wiring layer 140B may be formed simultaneously as illustrated in FIG. 9.

Figure 9:
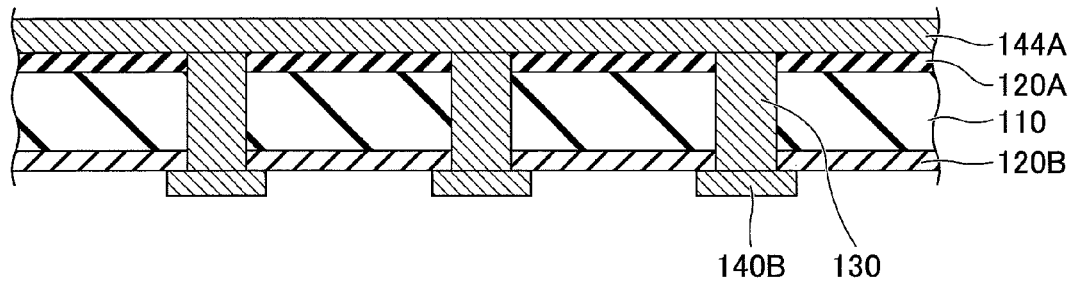
FIG. 9 is a drawing illustrating a variation of the production method of the embodiment.

FIG. 9 is a drawing illustrating a variation of the production method of the embodiment. In the production process illustrated in FIG. 9, the wiring layer 140B is formed concurrently with the penetrating electrodes 130 formed in FIG. 2D by utilizing a resist layer formed in advance on the lower surface of the insulating layer 120B, followed by removing the resist layer. In this production method, the upper surface of the insulating layer 120A will have a plating layer 144A formed thereon having the same thickness as the wiring layer 140B.

The plating layer 144A is then removed by a polishing process similarly to the manner in which the plating layer 141A is removed between FIG. 4B and FIG. 4C, followed by polishing the upper surface of the insulating layer 120A2 for planarization purposes (see FIG. 4C).

Figure 10:
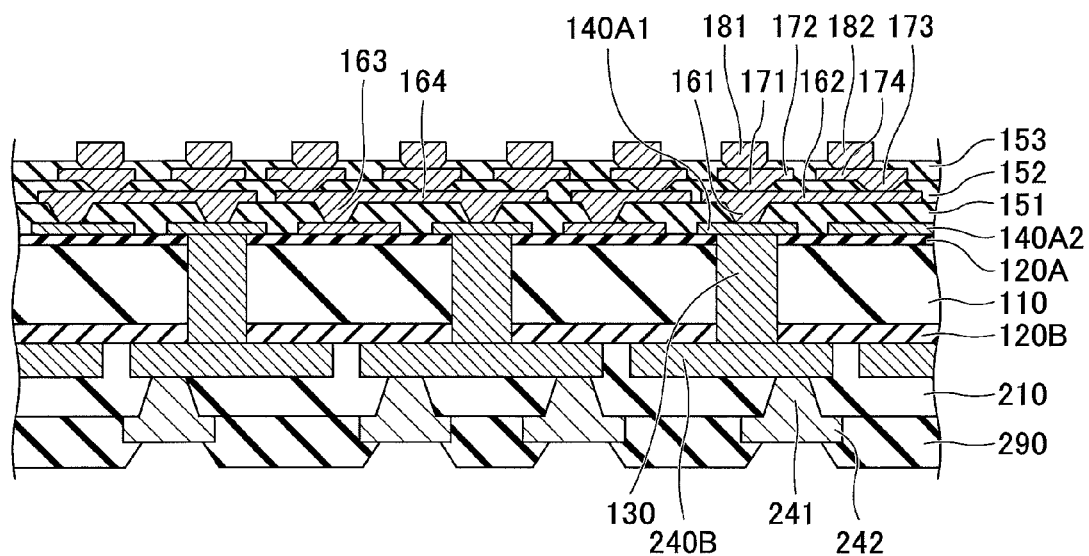
FIG. 10 is a cross-sectional view illustrating a variation of the wiring substrate of the embodiment.

Further, the wiring substrate 100 may be modified as illustrated in FIG. 10.

FIG. 10 is a cross-sectional view illustrating a variation of the wiring substrate of the embodiment.

A wiring substrate 200 differs from the wiring substrate 100 illustrated in FIG. 1 in the structure formed at the lower side of the insulating layer 120B. The structure at the lower side of the insulating layer 120B includes an insulating layer 240B, vias 241, a wiring layer 242, and a solder resist 290. The insulating layer 210 may be made of thermosetting resin containing epoxy resin, and may include glass cloth.

The wiring substrate 200 has two insulating layers on the lower side of the insulating layer 120B. Further, the wiring substrate 200 has the insulating layer 210 disposed through thermocompression bonding on the lower surface of the insulating layer 120B, which improves the stiffness of the whole structure. For example, the stiffness of the upper side of the wiring substrate 100 that is lower than the stiffness of the lower side may cause warpage. In such a case, the use of the insulating layer 210 serves to reduce the warpage.

The wiring substrate 200 having such a structure may have a thickness slightly greater than the thickness of the wiring substrate 100 illustrated in FIG. 1, but still has a relatively reduced thickness, compared with a conventional wiring substrate. Further, the use of organic substrate materials makes it possible to provide the wiring substrate at considerably lower cost than in the case of providing a silicon-substrate-based interposer.

The descriptions of a wiring substrate and a method of making the wiring substrate according to exemplary embodiments have been provided heretofore. The present invention is not limited to these embodiments, but various variations and modifications may be made without departing from the scope of the present invention.

According to at least one embodiment, a thinner wiring substrate and a method of making such a thinner wiring substrate are provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out in the following clause:

A method of making a wiring substrate, comprising:
  forming a first insulating layer containing no filler on a first surface of a core layer;
  forming a penetrating hole penetrating the core layer and the first insulating layer in a thickness direction thereof;
  forming a penetrating electrode in the penetrating hole;
  forming a first plating layer on the first insulating layer at a first surface thereof facing away from the core layer;
  performing polishing to remove the first plating layer and further to planarize the first surface of the first insulating layer and an end face of the penetrating electrode; and
  forming a first wiring layer on the first surface of the first insulating layer and the end face of the penetrating electrode.

What is claimed is:
1. A wiring substrate, comprising:
  a core layer having a penetrating hole;

a first insulating layer disposed on a first surface of the core layer and having a first opening at a position of the penetrating hole, the first insulating layer containing no filler;

a penetrating electrode disposed in the penetrating hole and in the first opening; and a first wiring layer laminated both on the first insulating layer at a first surface thereof facing away from the core layer and on an end face of the penetrating electrode;

a second insulating layer disposed on a second surface of the core layer and having a second opening at a position of the penetrating hole; and a second wiring layer laminated on the second insulating layer at a second surface thereof facing away from the core layer, the second wiring layer being electrically connected to the penetrating electrode through the second opening, wherein the first surface of the first insulating layer and the end face of the penetrating electrode are planarized, and wherein the penetrating electrode is disposed in the penetrating hole, in the first opening, and in the second opening, and the first wiring layer has patterns that are more micro-miniaturized than patterns of the second wiring layer.

2. The wiring substrate as claimed in claim 1, wherein the second insulating layer contains no filler.

3. The wiring substrate as claimed in claim 1, wherein a thickness of the second insulating layer is greater than a thickness of the first insulating layer.

4. The wiring substrate as claimed in claim 1, further comprising an insulating layer laminated to the second wiring layer.

5. The wiring substrate as claimed in claim 1, wherein the first insulating layer consists of resin.

* * * * *